(12) United States Patent
Shamarao et al.

(10) Patent No.: US 8,686,759 B2
(45) Date of Patent: Apr. 1, 2014

(54) BI-DIRECTIONAL CHANNEL AMPLIFIER

(75) Inventors: Prashant Shamarao, Duluth, GA (US);
Chris DeMarco, Alpharetta, GA (US);
Rohit Singhal, Duluth, GA (US);
Robert Bishop, Suwanee, GA (US);
Alex Reed, Atlanta, GA (US)

(73) Assignee: Synaptics Incorporated, San Jose, CA (US)

( * ) Notice: Subject to any disclaimer, the term of this patent is extended or adjusted under 35 U.S.C. 154(b) by 474 days.

(21) Appl. No.: 12/712,025

(22) Filed: Feb. 24, 2010

(65) Prior Publication Data

US 2011/0032006 A1 Feb. 10, 2011

Related U.S. Application Data

(60) Provisional application No. 61/232,357, filed on Aug. 7, 2009.

(51) Int. Cl.
*H03B 1/00* (2006.01)
*H03K 3/00* (2006.01)

(52) U.S. Cl.
USPC ............................................ 327/108; 381/28

(58) Field of Classification Search
USPC ........................................................ 327/108
See application file for complete search history.

(56) References Cited

U.S. PATENT DOCUMENTS

| | | | |
|---|---|---|---|
| 6,262,939 B1 * | 7/2001 | Matsui | 365/233.12 |
| 6,580,655 B2 * | 6/2003 | Jacunski et al. | 365/230.03 |
| 7,002,858 B2 * | 2/2006 | Lee | 365/200 |
| 7,073,083 B2 * | 7/2006 | Litwin et al. | 713/324 |
| 7,256,647 B2 * | 8/2007 | DeBrita et al. | 330/2 |
| 7,423,698 B2 * | 9/2008 | Hashimoto | 348/707 |
| 7,898,325 B2 * | 3/2011 | Hasan Abrar | 330/51 |
| 7,944,301 B1 * | 5/2011 | Kim | 330/263 |
| 2001/0050905 A1 * | 12/2001 | Shin | 370/296 |
| 2009/0279473 A1 * | 11/2009 | Lu et al. | 370/315 |
| 2010/0185792 A1 * | 7/2010 | Yao et al. | 710/33 |
| 2011/0150055 A1 * | 6/2011 | Qu et al. | 375/220 |
| 2011/0299638 A1 * | 12/2011 | Gauthier | 375/343 |

* cited by examiner

*Primary Examiner* — Elias Mamo
(74) *Attorney, Agent, or Firm* — Osha Liang LLP

(57) ABSTRACT

An AUX channel amplifier for amplifying data in the AUX channel of a Display Port device. In some embodiments, the amplifier includes a first amplifier coupled to amplify a signal from a source to a sink and a second amplifier coupled to amplify a signal from the sink to the source. A slicer can be utilized to digitize the signal from the source. In some embodiments, a clock and data recovery can be utilized to receive signals from the source and a second clock and data recovery can be utilized to receive signals from the sink. A controller determine the direction of data flow and enables the first amplifier or the second amplifier accordingly.

24 Claims, 6 Drawing Sheets

BI-DIRECTIONAL CHANNEL AMPLIFIER

CROSS-REFERENCE TO RELATED APPLICATIONS

The present application relates to and claims priority to U.S. Provisional Patent Application No. 61/232,357 filed on Aug. 7, 2009, the disclosure of which is incorporated herein by reference in its entirety.

BACKGROUND

1. Technical Field

Some embodiments according to the present invention relate to a bi-directional signal amplifier, for example an amplifier for the auxiliary channel in DisplayPort Devices.

2. Discussion of Related Art

The DisplayPort standard is a video standard for providing video data between digital devices and display devices. The current DisplayPort standard can provide for both high-resolution video and audio data. Data is transmitted between a source and a display over 1, 2, or 4 lanes of data. In the DisplayPort standard, an Auxiliary channel is utilized to communicate control data and a hot plug line is utilized to indicate to a DisplayPort source that a DisplayPort device is active. As the DisplayPort standard becomes more widespread, there is increasing interest in devices that utilize the standard. There is also interest in providing for the integrity of signals utilized in the DisplayPort systems.

Therefore, there is a need for improved integrity of various signals, for example control signals on the Auxiliary channel in DisplayPort Devices.

SUMMARY

In accordance with some embodiments of the present invention an AUX channel amplifier is presented. An AUX channel amplifier according to some embodiments can include a first amplifier coupled to amplify a signal from a source to a sink; a second amplifier coupled to amplify a signal from the sink to the source; and a controller coupled to the first amplifier and the second amplifier. In some embodiments, the controller enables the first amplifier when data is transmitted from the source to the sink and enables the second amplifier when data is transmitted from the sink to the source.

A method of amplifying signals in an AUX channel according to some embodiments of the present invention includes enabling a first amplifier coupled to receive a source signal from the source and provide an amplified source signal to the sink when the source signal is sent from the source to the sink; and enabling a second amplifier coupled to receive a sink signal from the sink and provide an amplified sink signal to the source when the sink signal is sent from the sink to the source.

These and other embodiments are further disclosed below with reference to the following drawings.

In the Figures, elements having the same or similar functions have the same designations.

DETAILED DESCRIPTION

Reference will now be made in detail to embodiments of the present invention, examples of which are illustrated in the accompanying drawings.

The DisplayPort standard is fully described in the VESA DisplayPort Standard, Version 1, Revision 1a, released Jan. 11, 2008, available from the Video Electronics Standard Association (VESA), 860 Hillview Court, Suite 150, Milpitas, Calif. 95035, which is herein incorporated by reference in its entirety. One skilled in the art will recognize that embodiments of the present invention can be utilized with other video display standards that utilize bi-directional control lines such as an Auxiliary channel in the DisplayPort standard.

Figure 1:
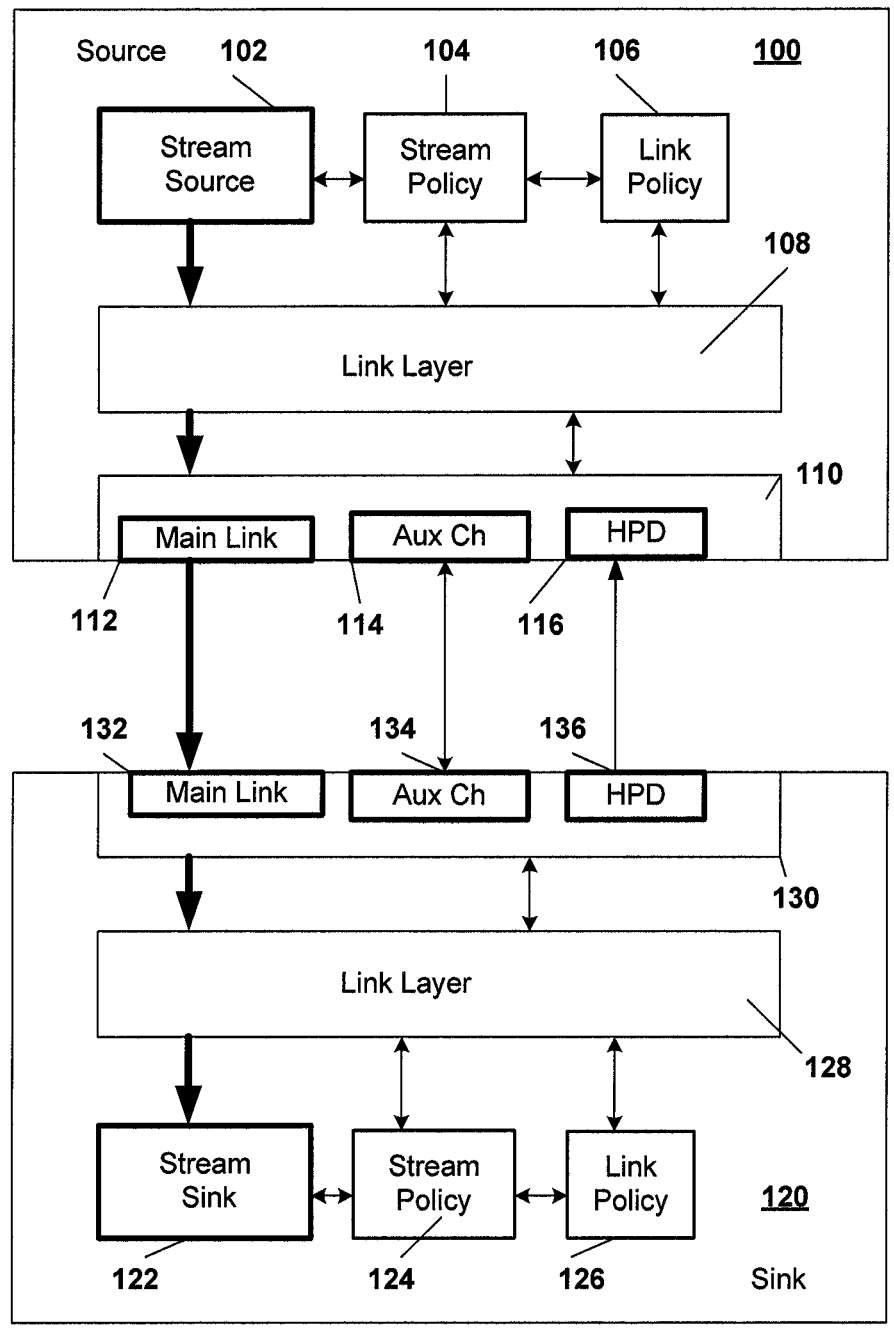
FIG. 1 illustrates aspects of the DisplayPort standard.

The DisplayPort (DP) standard is illustrated in FIG. 1. FIG. 1 shows a video source 100 in communication with a video sink 120. Source 100 is a source of video data. Sink 120 receives the video data for display. Data is transmitted between source 100 and sink 120 through three data links: a main link, an auxiliary channel, and a hot plug detect (HPD). Source 100 transmits the main link data between main link 112 of source 100 and main link 132 of sink 120, which are high bandwidth forward transmission links. Auxiliary channel data is transmitted between auxiliary channel 114 of source 100 and auxiliary channel 134 of sink 120, which are bi-direction auxiliary channels. HDP data is transmitted between HDP 116 of source 100 and HDP 136 of sink 136.

The DP standard currently provides for up to 10.8 Gbps (giga bits per second) through main link 112, which may support greater than QXGA (2048×1536) pixel formats, and greater than 24 bit color depths. Further, the DP standard currently provides for variable color depth transmissions of 6, 8, 10, 12, or 16 bits per component. In accordance with the DP standard, bi-directional auxiliary channel 114 provides for up to 1 Mbps (mega bit per second) with a maximum latency of 500 micro-seconds. Furthermore, a hot-plug detection channel 116 is provided. The DP standard provides for a minimum transmission of 1080 p lines at 24 bpp at 50/60 Hz over 4 lanes at 15 meters.

Additionally, the DP standard supports reading of the extended display identification data (EDID) whenever sink 120 (which typically includes a display, but may also be a repeater or a duplicator) is connected to power. Further, the DP standard supports display data channel/command interface (DDC/CI) and monitor command and controls set (MMCS) command transmission. Further, the DP standard supports configurations that do not include scaling, a discrete display controller, or on screen display (OSD) functions.

The DP standard supports various audio and visual content standards. For example, the DP standard supports the feature sets defined in CEA-861-C for transmission of high quality uncompressed audio-video content, and CEA-931-B for the transport of remote control commands between sink 120 and source 100. The DP standard supports up to eight channels of linear pulse code modulation (LPCM) audio at 192 kHz with a 24 bit sample size. The DP standard also supports variable video formats based on flexible aspect, pixel format, and refresh rate combinations based on the VESA DMT and CVT timing standards and those timing modes listed in the CEA-861-C standard. Further, the DP standard supports industry standard colorimetry specifications for consumer electronics devices, including RGB and YCbCr 4:2:2 and YCbCr 4:4:4.

As shown in FIG. 1, data is provided by stream source 102 to a link layer 108. Link layer 108 is coupled to provide data to physical layer 110. The data provided by stream source 102 can include video data. Link layer 108 packs the video data into one or more lanes and transmits the data to physical layer 110. Main link 112, auxiliary channel 114, and HPD 116 are included in the physical layer, which provides the signaling to transmit data to sink 120.

Sink 120 also includes a physical layer 130, which includes main link 132, auxiliary channel 134, and HPD 136, a link layer 128, and a stream sink 122. Stream sink 122 can, for example, be a video display and the data provides line and frame format associated with displaying video. Physical layer 130 receives the signals from physical layer 110, typically over a cable, and recovers data that had been transmitted by source 100. Link layer 128 receives the recovered data from physical layer 130 and provides video data to stream sink 122. Stream policy 104 and link policy 106 provide operating parameters to link layer 108. Similarly, stream policy 124 and link policy 126 provide policy data to link layer 128.

As discussed above, source 100 includes a physical layer 110 that includes main link 112, auxiliary channel 114, and HDP 116. Correspondingly, sink 120 includes a physical layer 130 with a main link 132, an auxiliary channel 134, and HDP 136. A cable and appropriate connectors are utilized to electronically couple main link 112 with main link 132, auxiliary channel 114 with auxiliary channel 134, and HDP 116 with HDP 136. In accordance with the DP standard, main link 112 transmits one, two, or four lanes that support 2.7 Gbps and 1.62 Gbps per lane, which is determined by the quality of the connection between main link 112 and main link 132. Physically, each lane can be an ac-coupled, doubly terminated differential pair of wires.

The number of lanes between main link 112 and main link 132 is one, two, or four lanes. The number of lanes is decoupled from the pixel bit depth (bpp) and component bit depth (bpc). Component bit depths of 6, 8, 10, 12, and 16 bits can be utilized. All of the lanes carry data and therefore the clock signal is extracted from the data stream. In accordance with the DisplayPort standard, the data stream is encoded with the ANSI 8B/10B coding rule (ANSI X3.230-1994, clause 11). Some embodiments of the invention may be utilized with other bidirectional transmission standards.

As discussed above, the connection between AUX channel 114 of source 100 and AUX channel 134 of sink 120 is a bi-directional auxiliary channel 114 that provides for up to 1 Mbps (mega bit per second) with a maximum latency of 500 micro-seconds. The connection between AUX channel 114 and AUX channel 134 is also an ac-coupled, doubly terminated differential pair of wires. In existing systems, AUX channel signal integrity is assigned a very low priority. As a result, AUX channel signals often are poorly designed and do not meet the specifications of the DP standard. In addition, new platform architectures include multiple AUX channel signals MUX-ed between different sources (along with the Main Link data). Such MUX-ing may result in worse signal integrity on the AUX bus. So, a circuit that improves the integrity of AUX channel signals can be of great benefit in current and future platforms that utilize the DisplayPort standard. Further, improving the integrity of other bi-direction signals in other environments may also be beneficial.

AUX channel data is not expected to be modified by devices that are not classified as stream sources or sinks. Devices such as buffers, signal integrity cleaners, MUXes, and DeMUXes, therefore, should not modify the data stream through the channel. In addition, such devices do not include content protection hardware (HDCP/DPCP), and are not expected to terminate or generate AUX channel transactions. Terminating or generating AUX channel transactions can cause significant delays during link training and other communication between the stream source 100 and stream sink 120. AUX communication is expected to be between the stream source 100 and the stream sink 120 while the devices in the path are simply expected to monitor and bypass the AUX transactions.

Some embodiments of the present invention improve signal integrity on the AUX channel of a Display Port device. The AUX channel in a Display Port device is an AC-coupled bidirectional differential bus. Therefore, amplifying the signals on this bus involves correctly detecting direction of data transfer without losing any data or interfering with other drivers on the data bus.

Figure 2:
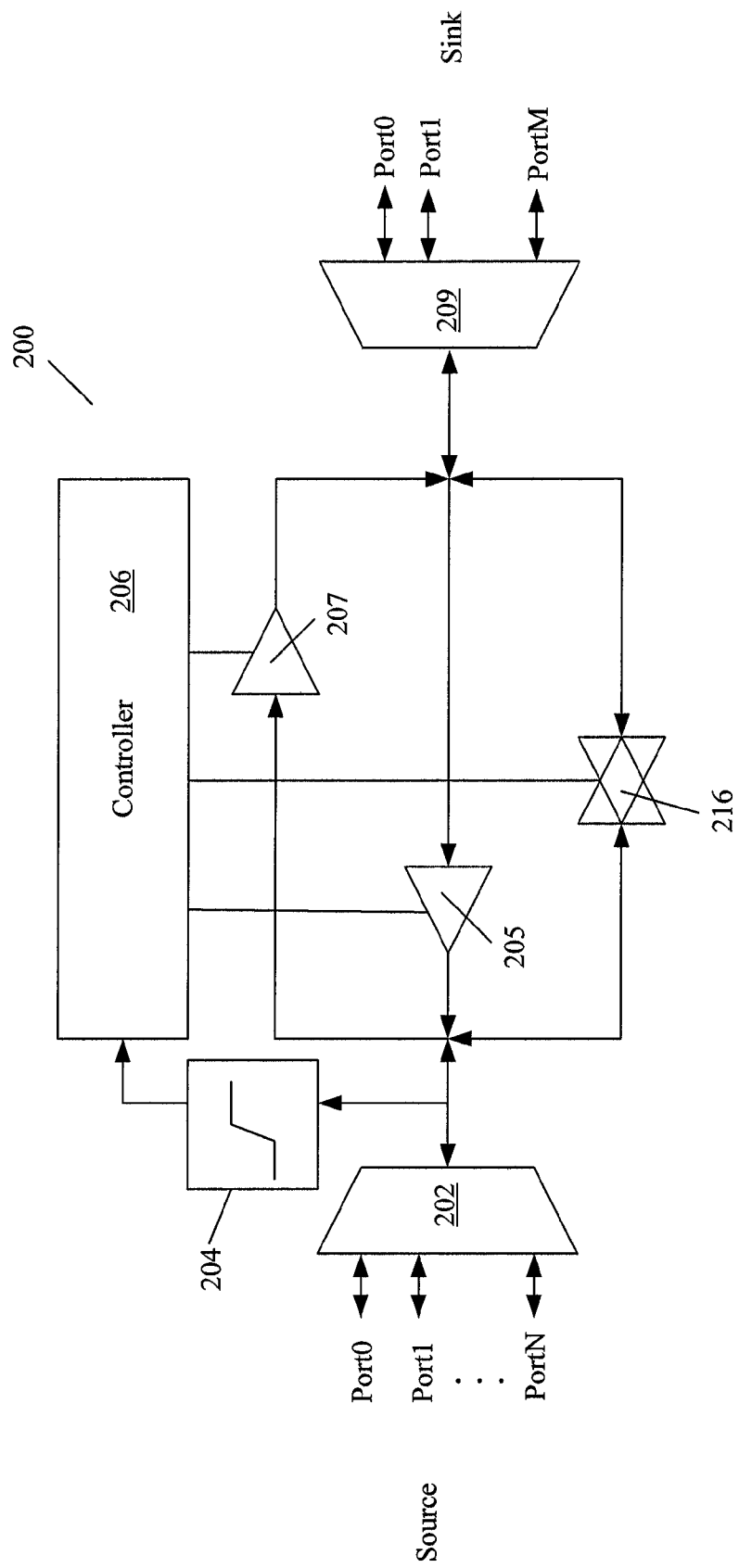
FIG. 2 illustrates an auxiliary channel amplifier according to some embodiments of the present invention.

FIG. 2 illustrates an embodiment of an AUX channel amplifier 200 according to some embodiments of the present invention. AUX channel amplifier 200 can be positioned anywhere in the link between auxiliary channel 114 of source 100 and auxiliary channel 134 of sink 120. In particular, AUX channel amplifier 200 may be incorporated into sink 120 or into source 100. As shown in FIG. 2, AUX channel amplifier 200 can receive signals from any number of individual sources, designated Port0 through PortN, into multiplexer 202 and supply signals to any number of sinks, labeled Port0 through PortM, through multiplexer 209. In embodiments that include one or both of multiplexers 202 and 209, a switch controller that may be included in controller 206 can make connections between any of the ports into multiplexer 202 to any of the ports into multiplexer 209. Additionally, multiplexers 202 and 209 are bi-directional. Further, in some embodiments a broadcast mode can be achieved so that data from one source can be transmitted to several sinks at once.

Therefore, amplifier 200 can receive multiple AUX channel signals from multiple Display Port sources 100, port0 through portN, into a multiplexer 202, where one of the input signals is selected for processing. A slicer 204 provides a digitized signal to a controller 206. Controller 206 is coupled to control source amp 207, sink amp 205, and, if present, bidirectional pass gate 216. For data being transmitted from source 100 to sink 120, source amp 207 is enabled so that signals can pass from multiplexer 202 to sink 120. For data being transmitted from sink 120 to source 100, sink amp 205 is enabled so that signals pass from sink 120 to source 100. In some embodiments where bidirectional pass gate 216 is included, before the direction of data transmission is determined by controller 206, bidirectional pass gate 216 is activated, which allows data to be transmitted in both directions.

In some embodiments, pass gate 216 may be included but not utilized during normal operation of amplifier 200. Instead, pass gate 216 may be utilized in a debug mode to help analyze problems with amplifier 200 operating in amplification mode.

Figure 3:
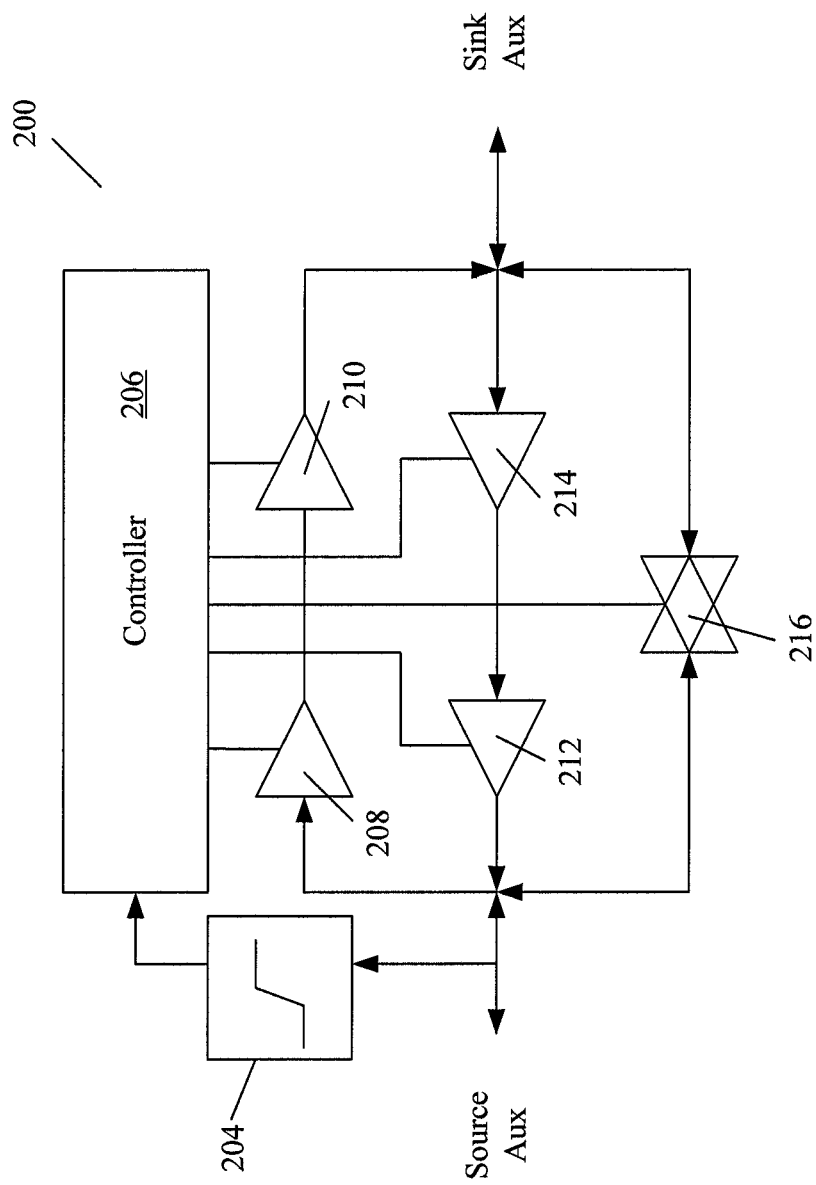
FIG. 3 illustrates an auxiliary channel amplifier according to some embodiments of the present invention.

As shown in FIG. 3, some embodiments of amplifier 200 according to the present invention include amplifiers 208 and 210 in place of source amp 207 in the source 100 to sink 120 direction. Furthermore, sink amp 205 may include amplifiers 214 and 212 in the sink 120 to source 100 direction. Slicer 204 converts AUX channel signals to digital levels so that controller 206 can determine start and stop conditions and control enables of all amplifiers 208-214 and, if present, the pass gate 216 accordingly. In the embodiments shown in FIG. 2, multiple sources 100 can be MUX-ed in multiplexer 202 to connect to one sink 120 and multiple sinks 120 can be MUX-ed in multiplexer 209. One skilled in the art will recognize that some embodiments of the invention can be used with any arbitrary number of sources and sinks MUX-ed/DeMUX-ed together. Further, although pairs of amplifiers are shown in FIG. 3, amplifiers 207 and 205 shown in FIG. 2 can include any number of amplifiers in each direction. Additionally, although particular examples are provided here in the context of the DisplayPort AUX standard, embodiments of the invention may be applicable to other bi-directional data transmission environments as well.

In the AUX channel protocol, transmission of pre-charge and SYNC patterns is performed at the beginning of each transaction and a STOP bit is transmitted at the end of each transaction. Under idle conditions the AUX channel bus is tri-stated and the P/N signals in the differential pair stay very close to each other at the common mode voltage level. Since the link is AC coupled, the common voltage levels at the transmitter and receiver are decoupled from each other. As a result of this decoupling, under idle condition, the signals on the AUX channel should not be blindly amplified and transmitted since the data detected by the receiver will then be unpredictable.

In some embodiments of the present invention, the AUX channel is over-sampled by slicer 204 to reliably detect the pre-charge sequence that occurs at the beginning of each AUX transaction. Also, in some embodiments of the invention the AUX transaction is monitored to determine the end of the transaction, for example by detecting a STOP bit in controller 206, in order to enable amplification of the reply transaction that follows in the opposite direction on the bus.

In embodiments that include pass gate 216, upon startup, pass gate 216 is enabled and the receivers coupled to source 100 are enabled. When a pre-charge sequence is detected by controller 206, control is switched from pass gate 216 to amplifier 207 to transmit data from source 100 to sink 120.

In embodiments where pass gate 216 is not included, amplifier 207 is enabled as soon as the pre-charge sequence is detected. Detection of the pre-charge sequence can be accomplished in several ways. In some embodiments, the pre-charge sequence can be detected in controller 206 from signals received from slicer 204. In some embodiments that do not include pass gate 216, data may be collected in controller 206 until pre-charge detection is complete and then sent out starting with the stored data (used for detection). Such methods result in latencies on the AUX link because the data sent out is often a delayed version of the incoming data. These latencies can become significant if there are multiple buffer devices on the AUX bus.

Figure 4:
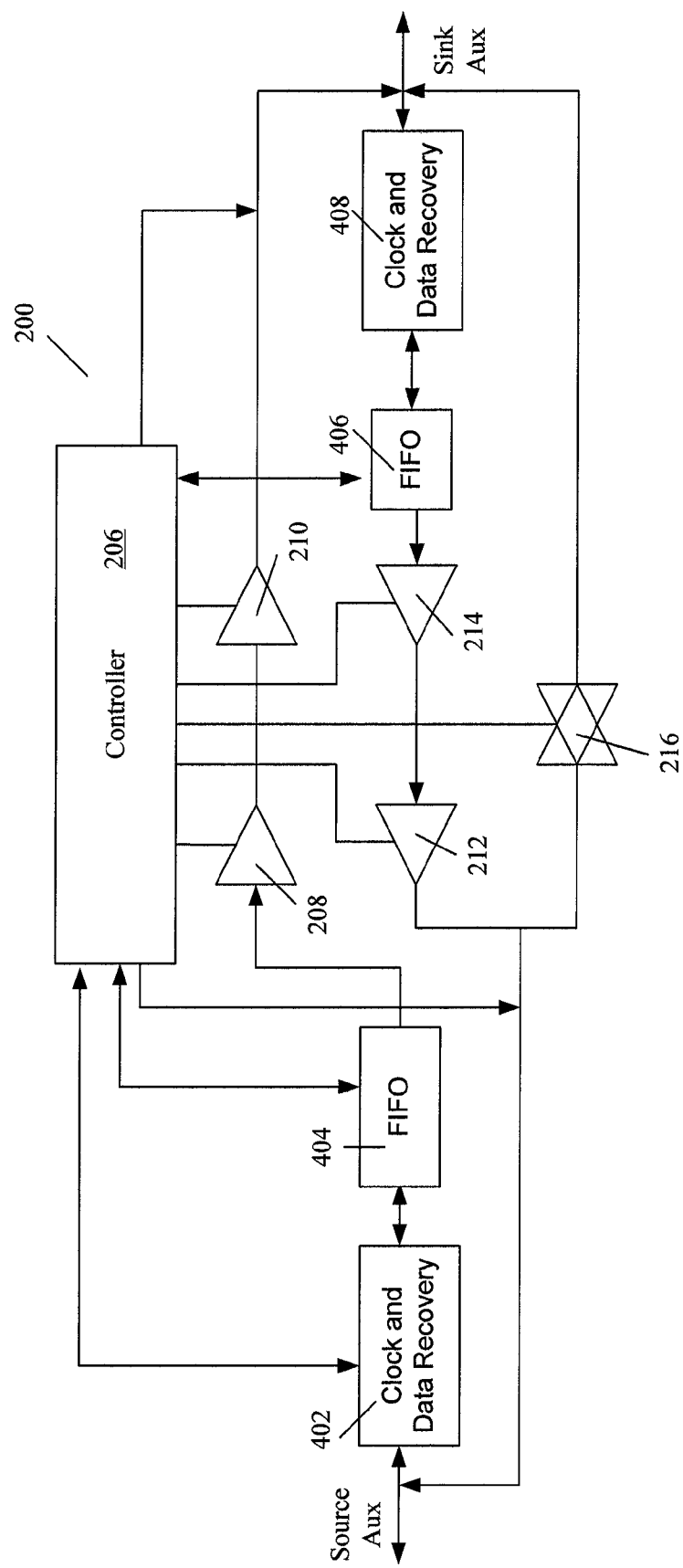
FIG. 4 illustrates an auxiliary channel amplifier according to some embodiments of the present invention.

Some embodiments of the present invention may operate in a similar fashion in a fast AUX (FAUX) system. FIG. 4 illustrates an embodiment that is compatible with a FAUX system. A FAUX channel is expected to run at approximately 1 Gbps. As a result, amplifier 200 includes a clock and data recovery block 402 and First-In-First-Out (FIFO) 404 to receive data from source 100 and a clock and data recovery block (CDR) 408 and FIFO 406 to receive data from sink 120. In some embodiments, clock and data recovery is performed every time a burst of data is transmitted. Therefore, a FAUX amplifier according to some embodiments of the present invention analyzes the incoming data stream to identify a pre-amble pattern in the data. During this analysis period, a clock and data recovery engine acquires phase lock and aligns the internal circuits to the incoming data phase. Once the pre-amble has been identified, the payload data is fed into FIFO 404 while a pre-amble is transmitted on the output to sink 120 so that the downstream sink can acquire lock on the data. Once the pre-amble has been transmitted on the output, the payload data can be read out of FIFO 404 and transmitted.

In this fashion, amplification on the channel for FAUX mode can be achieved. A similar technique works for FAUX transmission from sink 120 to source 100. Although latency is added in this method, the latency is small because the data rates are very high compared to those of the slow AUX (1 Mbps). In some embodiments, especially with FAUX transmissions, a pass gate such as pass gate 216 may not be effectively utilized because of the short bit times involved and the timing of CDR 402 or CDR 408 (depending on data transmission direction) to acquire bit-lock and symbol-lock.

In some embodiments of the present invention that includes pass gate 216, pass gate 216 is enabled to always keep the data on the output side current. When the pre-charge sequence is detected (which often can be done in 1-2 bit times), control is passed to the amplifier path and gate 216 is disabled. In this method the first 1-2 bits of the pre-charge sequence are unamplified, but all bits thereafter are amplified. This is not an issue per the protocol since it is expected that there are a large number of pre-charge pulses (at least 26) at the beginning of each transaction. Once the STOP bit is detected the amplification is disabled and control is passed to pass gate 216 once again. Also, receivers connected to sink 120 are enabled to detect the start of transaction back from sink 120 to source 100. Once the transaction from sink 120 to source 100 is complete, control is passed back to pass gate 216 and the process is repeated for future transactions.

Figure 5:
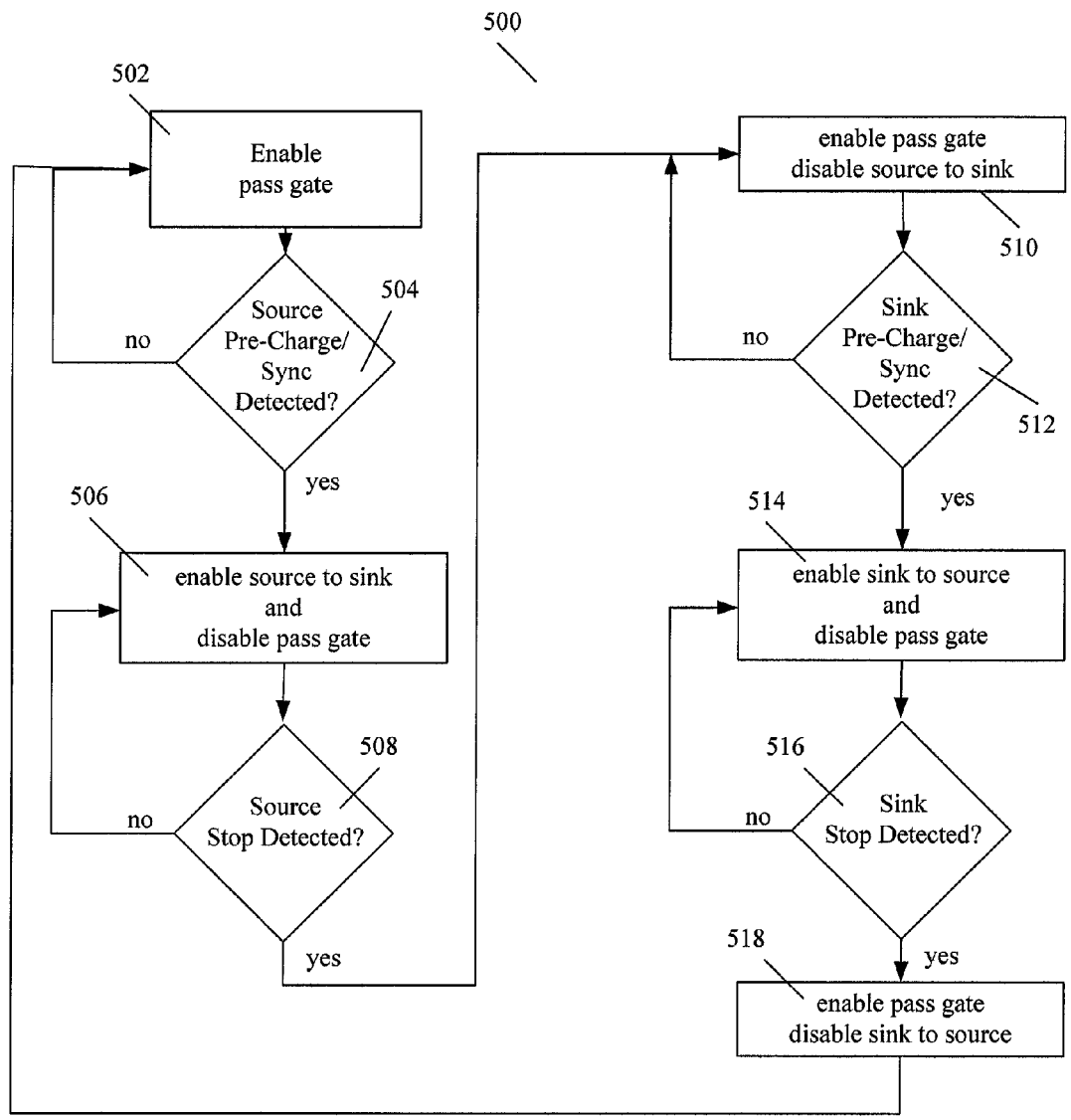
FIG. 5 illustrates operation of an auxiliary channel amplifier according to some embodiments of the present invention.

FIG. 5 illustrates a typical AUX channel transaction 500, such as can be performed on an example of amplifier 200 that includes pass gate 216, as shown in FIG. 2. In step 502, pass gate 216 is enabled so that data is transmitted freely between source 100 and sink 120. In step 504, controller 206 checks data received from slicer 204 for the pre/charge or sync signal. If a pre/charge or sync signal is not detected, then transaction returns to step 502. If the pre-charge/sync signal is detected, then controller 206 enables amplifier 207 and disables pass gate 216. In step 508, controller checks data received from slicer 204 for a stop signal. If a stop is not detected, then transaction 500 returns to step 506. However, if a stop is detected, transaction 500 proceeds to step 510 where amplifier 207 is disabled and pass gate 216 is enabled.

In step 512, controller 206 checks data received from slicer 204 for a pre-charge/sync signal. If the pre-charge/sync signal is not detected, then transaction 500 returns to step 510. If the pre-charge/sync signal is detected, then controller 206 disables pass gate 216 and enables amplifier 205 in step 514. In step 516, controller 206 checks the data received from slicer 204 for a stop signal. If the stop signal is not detected, then transaction 500 returns to step 514. If the stop signal is detected, then transaction 500 disables amplifier 205 and enables pass gate 216 in step 518. Transaction 500 then returns to step 502.

Figure 6:
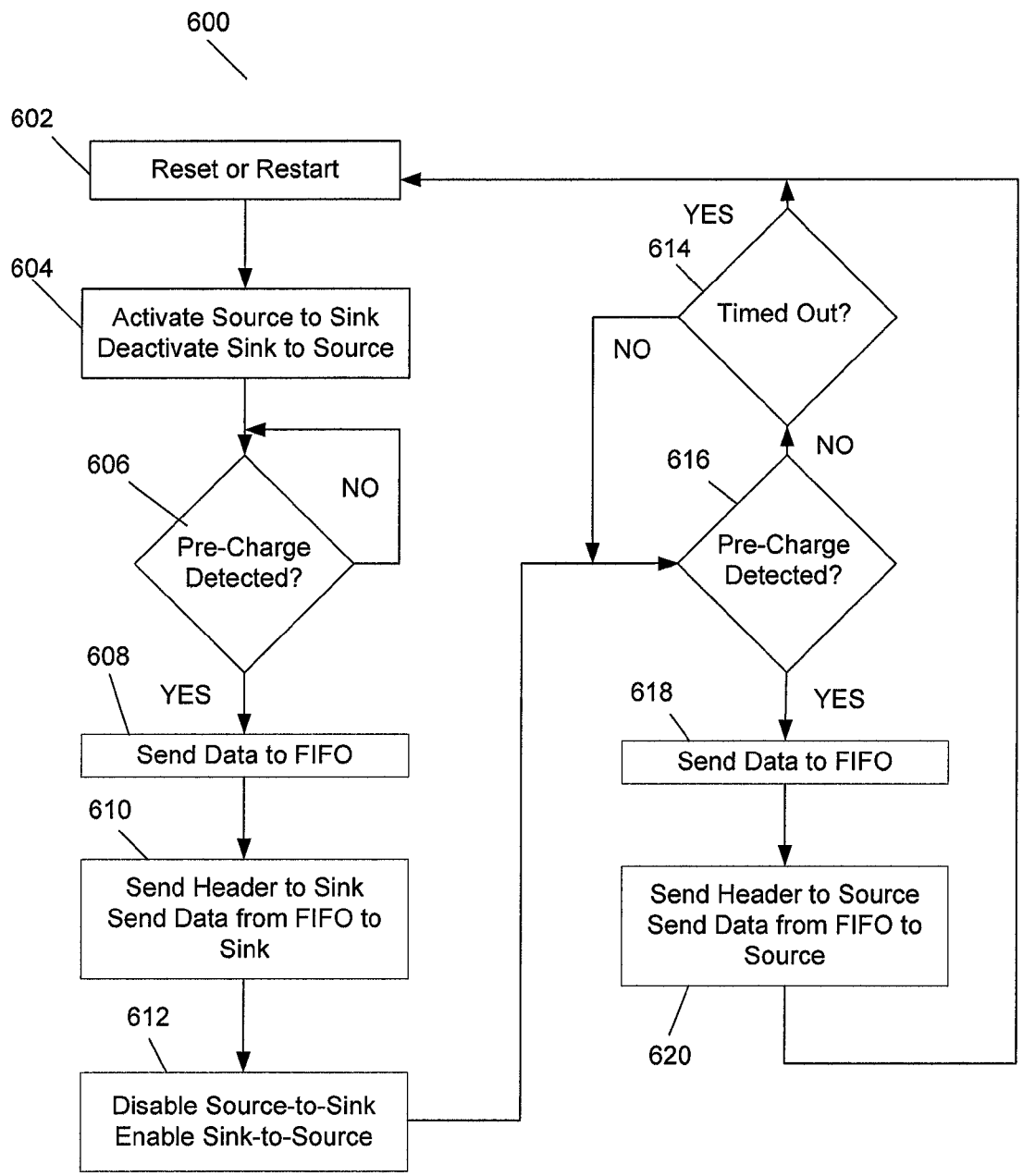
FIG. 6 illustrates operation of an auxiliary channel amplifier according to some embodiments of the present invention.

FIG. 6 illustrates an operation sequence 600 for an embodiment of amplifier 200 such as that shown in FIG. 4, without inclusion of pass gate 216. Such an embodiment may be appropriate for the FAUX DisplayPort standard as described above. As shown in FIG. 6, operation sequence 600 starts with a reset or restart step 602. From step 602, operation 600 proceeds to step 604 where amplifier 207 (amplifiers 208 and 210 shown in FIG. 4) is activated and CDR 402 and FIFO 404 are enabled to accept new data. Further, amplifier 205 (show as amplifiers 212 and 214 in FIG. 4) is disabled along with CDR 408 and FIFO 406. Operation 600 then transitions to step 606. In step 606, amplifier 200 checks for a pre-charge sequence. If the pre-charge sequence is not received, then operation 600 returns to step 606 to check again for a pre-charge sequence. When a pre-charge sequence is detected in step 606, operation 600 proceeds to step 608.

In step 608, controller 206 directs CDR 402 to send received data to FIFO 404. Operation 600 then proceeds to step 610. In step 610, controller 206 sends a header directly to sink 120 and enables amplifier 207, and directs that data from FIFO 404 be sent to sink 120. From step 610, once the data is transferred to sink 120, operation 600 transitions to step 612, where the source-to-sink data transition is disabled and the sink-to-source data transition is enabled. After step 612, amplifier 200 is prepared to transfer data from sink 120 to source 100 in answer to the data transmitted from source 100 to sink 120.

From step 612, operation 600 transitions to step 616. In step 616, operation 600 checks to see if a pre-charge sequence is received from sink 120. If not, then operation 600 transitions to state 614 to check if the transition has timed out or not. In step 614, if the transition has timed out, then operation 600 transitions back to step 602. In step 614, if the transition has not timed out, then operation 600 transitions back to step 616.

If a pre-charge sequence is detected in step 626, then operation 600 transitions to step 618 where data is directed to FIFO 406. Operation 600 then transitions to step 620. In step 620, a header is sent to source 100. Then the data is transmitted through amplifier 605 from FIFO 406 to source 100. After step 620 is completed and the data is transmitted from sink 120 to source 100, operation 100 transitions back to step 602.

In some embodiments, amplifier 200 as shown in FIGS. 2-4 can modify exchanges between source 100 and sink 120 to ensure consistency between the main link and the AUX channel of the DisplayPort interface and can set parameters that control the operation of amplifier 200. For example, parameters that control amplifiers 205 and 207 may be set. The ability to modify the exchanges allows for optimization of the link between source 100 and amplifier 200 and from amplifier 200 to sink 120.

For example, in the DisplayPort standard, during link training, source 100 can send information to sink 120 regarding drive strength or pre-emphasis (DS/PE) levels to utilize when transmitting on the AUX channel. The DS/PE levels can be controlled by controlling amplifiers 205 and 207. Amplifier 200 can monitor transactions between source 100 and sink 120 and update the DS/PE parameters based on transmission from source 100 or from sink 120. For example, in a case where the link between source 100 and amplifier 200 is short but the link between amplifier 200 and sink 120 is long, sink 120 may request a high DS/PE setting. This high DS/PE setting request can be intercepted by amplifier 200, which in turn requests a low DS/PE setting from source 100. In this fashion, source 100 then provides signals according to a low DS/PE setting to Amplifier 200, which in turn provides signals at a high DS/PE setting to sink 120. In some embodiments, other parameters may be similarly intercepted and set according to the interactions between source 100, amplifier 200, and sink 120.

The embodiments of the invention described here are exemplary only and are not intended to limit the scope of the invention. One skilled in the art may recognize various modifications to the embodiments specifically described. These modifications are intended to be within the scope of this disclosure. As a result, the invention is limited only by the following claims.

What is claimed is:

1. An auxiliary (AUX) channel amplifier, comprising:
   a first amplifier path comprising a first amplifier and configured to amplify a signal on the AUX channel from a source to a sink;
   a second amplifier path comprising a second amplifier and configured to amplify a reply signal on the AUX channel from the sink to the source;
   a slicer configured to:
      detect a pre-charge sequence at a start of an AUX transaction comprising the signal; and
      detect a stop bit at an end of the AUX transaction comprising the signal; and
   a controller coupled to the first amplifier and the second amplifier, the controller configured to:
      enable the first amplifier to amplify the signal in response to detection of the pre-charge sequence; and
      enable the second amplifier to amplify the reply signal after detection of the stop bit.

2. The AUX channel amplifier of claim 1, wherein the first amplifier path includes a plurality of amplifiers.

3. The AUX channel amplifier of claim 1, wherein the second amplifier path includes a plurality of amplifiers.

4. The AUX channel amplifier of claim 1, further comprising:
   a pass gate coupled between the sink and the source and bypassing the first amplifier path and the second amplifier path,
   wherein the controller is further configured to disable the pass gate in response to detection of the pre-charge sequence.

5. The AUX channel amplifier of claim 4, wherein the controller is further configured to enable the pass gate when data direction is not determined.

6. The AUX channel amplifier of claim 1, wherein the controller sets parameters.

7. The AUX channel amplifier of claim 6, wherein the parameters are set in part based on the signal from the source to the sink.

8. The AUX channel amplifier of claim 6, wherein the parameters are set in part based on the reply signal from the sink to the source.

9. The AUX channel amplifier of claim 6, wherein the controller modifies contents of the AUX transaction between the source and the sink.

10. A method of transmitting signals between a source and a sink over an auxiliary (AUX) channel, comprising:
   activating a source-to-sink amplifier path comprising a first plurality of amplifiers, a first clock and data recovery (CDR) engine, and a first first-in-first-out (FIFO) buffer;
   identifying a pre-amble pattern in an incoming data stream from the source;
   acquiring, by the first CDR engine and based on the pre-amble pattern, a phase lock for the incoming data stream;
   writing, by the first CDR engine after acquiring the phase lock and while the pre-amble pattern is transmitted to the sink, payload data from the incoming data stream to the first FIFO buffer;
   amplifying, by the first plurality of amplifiers and after the sink acquires the phase lock based on the pre-amble, the payload data read out from the first FIFO buffer and transferred to the sink;
   disabling the source-to-sink amplifier path;
   activating a sink-to-source amplifier path comprising second plurality of amplifiers, a second CDR engine, and a second FIFO buffer;
   writing, by the second CDR engine, reply data from the sink to the second FIFO buffer;
   amplifying, by the second plurality of amplifiers, the reply data read out from the second FIFO buffer and transferred to the source.

11. The method of claim 10, further including enabling a pass gate bypassing the source-to-sink amplifier path and the sink-to-source second amplifier path to allow unamplified signals to pass in either direction between the source and the sink.

12. The method of claim 11, wherein enabling the pass gate includes disabling the source-to-sink amplifier path and the sink-to-source amplifier path.

13. The method of claim 11, wherein activating the source-to-sink amplifier path includes disabling the sink-to-source amplifier path and the pass gate.

14. The method of claim 11, wherein activating the sink-to-source amplifier path includes disabling the source-to-sink amplifier path and the pass gate.

15. The method of claim 10, further including detecting a source pre-charge or sync prior to activating the source-to-sink amplifier path.

16. The method of claim 10, further including adjusting parameters in response to signals from the sink.

17. The method of claim 10, further including adjusting parameters in response to signals from the source.

18. The method of claim 10, further including modifying contents of a transaction between the source and the sink.

19. The amplifier of claim 1, wherein the AUX channel accompanies a main link.

20. The amplifier of claim 1, wherein the AUX channel is a DisplayPort AUX channel.

21. The method of claim 10, wherein the AUX channel accompanies a main link.

22. The method of claim 10, wherein the AUX channel is a DisplayPort AUX channel.

23. An auxiliary (AUX) channel amplifier connecting a source and a sink, comprising:
 a source-to-sink amplifier path comprising:
  a first first-in-first-out (FIFO) buffer;
  a first clock and data recovery (CDR) engine configured to write source data to the first FIFO buffer; and
  a first plurality of amplifiers configured to amplify the source data read from the first FIFO buffer and transferred to the sink;
 a sink-to-source amplifier path comprising:
  a second FIFO buffer;
  a second CDR engine configured to write sink data to the second FIFO buffer; and
  a second plurality of amplifiers configured to amplify the sink data read from the second FIFO buffer and transferred to the source; and
 a controller configured to:
  enable the source-to-sink amplifier path;
  identify, after the source-to-sink amplifier path is enabled, a pre-charge sequence from the source;
  disable the source-to-sink amplifier path after the source data is transferred from the first FIFO to the sink;
  enable the sink-to-source amplifier path after the source-to-sink amplifier path is disabled;
  identify, after the sink-to-source amplifier path is enabled, a pre-charge sequence from the sink; and
  disable the sink-to-source amplifier path after the sink data is transferred from the second FIFO to the source.

24. The AUX channel amplifier of claim 23, further comprising:
 a pass gate connected to the sink and the source and bypassing both the source-to-sink amplifier path and the sink-to-source amplifier path.

* * * * *